(12) United States Patent
Butler et al.

(10) Patent No.: US 7,190,437 B2
(45) Date of Patent: Mar. 13, 2007

(54) WIRELESS SIGNALING IN A LITHOGRAPHIC APPARATUS

(75) Inventors: Hans Butler, Best (NL); Stoyan Nihtianov, Eindhoven (NL); Petrus Wilhelmus Josephus Maria Kemper, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 35 days.

(21) Appl. No.: 10/747,615

(22) Filed: Dec. 30, 2003

(65) Prior Publication Data

US 2005/0140955 A1 Jun. 30, 2005

(51) Int. Cl.
- G03B 27/72 (2006.01)
- G03B 27/42 (2006.01)
- G03B 27/32 (2006.01)

(52) U.S. Cl. .............................. 355/69; 355/53; 355/77
(58) Field of Classification Search ................. 355/69, 355/53, 55, 67, 72, 75, 77; 250/208.1; 310/10, 310/12

See application file for complete search history.

(56) References Cited

U.S. PATENT DOCUMENTS

| | | |
|---|---|---|
| 2003/0164934 A1* | 9/2003 | Nishi et al. .................... 355/72 |
| 2003/0226951 A1* | 12/2003 | Ye et al. .................. 250/208.1 |

* cited by examiner

Primary Examiner—Peter B. Kim
(74) Attorney, Agent, or Firm—Pillsbury Winthrop Shaw Pittman, LLP

(57) ABSTRACT

A lithographic apparatus capable of wirelessly communicating control and power signals, is presented herein. In one embodiment, the apparatus comprises an illumination system to provide a beam of radiation, a support structure configured to support a patterning device that imparts the beam of radiation with a pattern in its cross-section, a substrate holder configured to hold a substrate, a projection system to project the patterned beam radiation onto a target portion of the substrate, and a wireless signaling system configured to transmit and receive information-bearing electromagnetic radiation. The wireless system comprises at least a transmitter to transmit the electromagnetic radiation and a first transducer configured to receive and convert the electromagnetic radiation into a first electrical signal containing the information which is used to control at least a portion of the support structure, the substrate table, the projection system, and the illumination system.

19 Claims, 8 Drawing Sheets

WIRELESS SIGNALING IN A LITHOGRAPHIC APPARATUS

BACKGROUND OF THE INVENTION

1. Field of the Invention

The present invention relates to a lithographic apparatus and, in particular, to wireless signaling for a lithographic apparatus.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning devices, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist).

In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti-parallel to this direction.

In order to obtain an accurate projection of the pattern onto the substrate, different requirements have to be met inside a lithographic apparatus. As an example, accurate displacement and positioning of both the substrate and the patterning devices are required, the environmental conditions inside the lithographic apparatus have to be monitored and maintained to meet the requirements. In order to obtain these requirements, the lithographic apparatus is equipped with a plurality of instruments such as sensors, actuators, pumps, etc. . . . In most cases, those instruments are wired to either a power supply and/or a control unit by cables or wires. Examples of such cables are optical fibers and electrically conductive wires provided with an insulation layer.

Due to an increased complexity of the lithographic apparatus, the number of wires and cables required for providing power to those instruments and for transporting information between those instruments and the control unit increases. These wires and cables may cause a number of problems inside the lithographic apparatus.

A further drawback of the application of wires and cables is that they are a potential source of contamination. The lithographic process usually takes place in a highly purified environment. As a particular example, this environment may be a vacuum environment. In case conventional cables or wires are used in such environments, outgassing of the insulation material surrounding the electrically conductive wire may occur. This outgassing may adversely affect the lithographic process.

An other drawback of the application of wires or cables is that it may reduce the reliability of the lithographic apparatus. The connectors connecting the instruments, the control unit or the power supply with the cable or wire may fail due to repetitive movement of the cable or wire. The wire or cable may also be damaged due to mechanical stresses.

SUMMARY OF THE INVENTION

Principles of the present invention, as embodied and broadly described herein, provide for a lithographic apparatus configured to wirelessly communicate signaling information. In one embodiment, the apparatus comprises an illumination system to provide a beam of radiation, a support configured to support a patterning device that imparts the beam of radiation with a pattern in its cross-section, a substrate holder configured to hold a substrate, a projection system to project the patterned beam radiation onto a target portion of the substrate, and a wireless signaling system configured to transmit and receive information-bearing electromagnetic radiation. The wireless system comprises at least a transmitter to transmit the electromagnetic radiation and a first transducer configured to receive and convert the electromagnetic radiation into a first electrical signal containing the information which is used to control at least a portion of the support structure, the substrate table, the projection system, and the illumination system.

As such, embodiments of the present invention at least partly overcome the problems mentioned. This and other objects are realized in the present invention, wherein the lithographic apparatus is arranged for co-operation with a transmitter for transmitting electromagnetic radiation, wherein the lithographic apparatus further comprises a first transducer for receiving the electromagnetic radiation and for converting the electromagnetic radiation into a power signal and/or a control signal.

Such an arrangement of a transmitter and a transducer that co-operates with the transmitter allows the transport of energy in a wireless manner, i.e. without the requirement of cables or wires and the conversion of energy into a power signal inside the lithographic apparatus. This power signal may be applied, as an example, to power a sensor or an actuator. Such an arrangement provides an improvement of the lithographic process: By reducing the number of cables or wires in the lithographic apparatus, mechanical short cuts between parts that can move relative to each other or between parts that are separated by a vibration isolation system are avoided or reduced, thereby improving the positioning accuracy during the lithographic process. Furthermore, outgassing of cables or wires is reduced by such an arrangement. It should be noted that the problem of outgassing is not restricted to vacuum applications but may also be an issue in more conventional applications that require purified air or nitrogen or any other fluid.

In addition to that, or as an alternative, the electromagnetic radiation received by the transducer may contain information that can be converted by the transducer into a control signal that, as an example, may be applied to control an actuator for positioning a stage or an optical element or to control a valve, or may be applied to control a sensor. In such an arrangement, the control signal can be wired in a conventional way from the transducer to the control unit, the control unit being connected to the actuator or sensor. It should be noted that in this respect, a laser beam from e.g. an interferometer should not be considered to contain information in the context of this application. In such an interferometer application, an optical sensor of the interferometer for receiving the laser beam merely obtains information from the laser beam with respect to e.g. a distance traveled, i.e. the information itself is not contained in the beam. The signal generated by the interferometer is a position measurement signal and is in the context of this application not considered as a control signal for controlling for example, the positioning device.

The electromagnetic radiation may be supplied from inside the lithographic apparatus or may be supplied from the outside. As an example, electromagnetic radiation may be transmitted by a laser beam from outside the apparatus to a photo-voltaic element inside the apparatus.

In a further embodiment of the present invention, the lithographic apparatus is equipped with an energy storage device. In such embodiment, the electromagnetic radiation received and converted by the first transducer can temporarily be stored until it is required to power, as an example, an actuator or a sensor. In this situation, the supply of electromagnetic radiation to the transducer may be discontinuous while the sensor or the actuator can be powered on a continuous basis. Various possibilities exist for storing the energy. As an example, the electromagnetic radiation received by the transducer may be applied to charge a battery or may be converted into kinetic energy.

In an other embodiment according to the present invention, the lithographic apparatus comprises a second transducer for converting a first electric signal into electromagnetic radiation and for transmitting this electromagnetic radiation to a receiver that converts the electromagnetic radiation into a second electric signal. In such embodiment, the information obtained from a sensor on a physical state of, as an example, the environmental conditions inside the lithographic apparatus or on the position of a precision stage can be communicated to a control unit without the use of a cable or wire between the sensor and the control unit. Such an arrangement can also be applied to convert an electric signal from a control unit or power source into electromagnetic radiation. The electric signal from the sensor, the control unit or the power source can be provided to the transducer in a conventional wired way. In such an embodiment, the receiver can be located inside or outside the lithographic apparatus. In a preferred embodiment, the control unit receiving the information obtained from the sensor, is also connected to the transmitter. In such an arrangement, the information obtained from the sensor can be processed in the control unit, and, as an example, be transmitted by the transmitter to a transducer connected to an actuator of the positioning device, for the purpose of controlling the actuator.

According to a further aspect of the invention, there is provided a device manufacturing method comprising, providing a beam of radiation using an illumination system, using patterning devices to impart the beam with a pattern in its cross-section, and projecting the patterned beam of radiation onto a target portion of the substrate. The method further senses a state of either the illumination system, the projection system, or the patterning devices or the substrate, produces an electric signal representing the state, and converts the electric signal into electromagnetic radiation by a first transducer and transmitting the electromagnetic radiation to a receiver.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning devices" used herein should be broadly interpreted as referring to means that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support supports, i.e. bares the weight of, the patterning devices. It holds the patterning devices in a way depending on the orientation of the patterning devices, the design of the lithographic apparatus, and other conditions, such as for example whether or not the patterning devices is held in a vacuum environment. The support can be using mechanical clamping, vacuum, or other clamping techniques, for example electrostatic clamping under vacuum conditions. The support may be a frame or a table, for example, which may be fixed or movable as required and which may ensure that the patterning devices is at a desired position, for example with respect to the projection system. Any use of the terms "reticle" or "mask" herein may be considered synonymous with the more general term "patterning devices".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Lithographic Projection Apparatus

Figure 1:
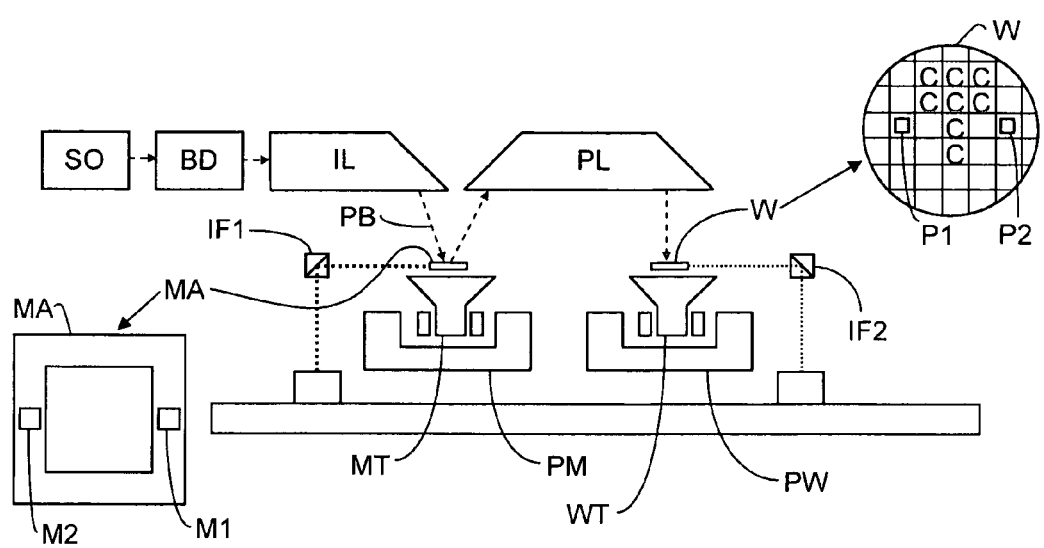
FIG. 1 depicts a lithographic apparatus according to the present invention.

FIG. 1 schematically depicts a lithographic projection apparatus according to a particular embodiment of the invention. The apparatus comprises:

a radiation system SO, BD, IL: configured to supply a beam PB of radiation (e.g. UV radiation such as for example generated by an excimer laser operating at a wavelength of 248 nm, 193 nm or 157 nm, or by a laser-fired plasma source operating at 13.6 nm). In this particular case, the radiation system also comprises a radiation source SO;

first support structure (a mask table) MT: for supporting patterning devices (e.g. a mask) MA and connected to first positioning mechanism PM for accurately positioning the patterning devices with respect to a projection system PL;

a second object table (substrate table or substrate holder) WT: provided with a substrate holder for holding a substrate W (e.g. a resist-coated silicon wafer), and connected to second positioning mechanism PW for accurately positioning the substrate with respect to projection system PL and measurement device IF (e.g., interferometric) to accurately indicate the position of the substrate and/or substrate table with respect to lens PL; and the projection system ("lens") PL: (e.g. a quartz and/or $CaF_2$ lens system or a catadioptric system comprising lens elements made from such materials, or a mirror system) configured to image an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example (with a transmissive mask). Alternatively, the apparatus may employ another kind of patterning mechanism, such as a programmable mirror array of a type as referred to above.

The illuminator IL receives radiation from a radiation source SO. The source and the lithographic apparatus may be separate entities, for example when the source is a plasma discharge source. In such cases, the source is not considered to form part of the lithographic apparatus and the radiation is generally passed from the source SO to the illuminator IL with the aid of a radiation collector comprising for example suitable collecting mirrors and/or a spectral purity filter. In other cases the source may be integral part of the apparatus, for example when the source is a mercury lamp. The source SO and the illuminator IL, may be referred to as a radiation system.

The illuminator IL may comprise adjusting mechanism for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, PB, having a desired uniformity and intensity distribution in its cross-section.

The beam PB is incident on the mask MA, which is held on the mask table MT. Being reflected by the mask MA, the beam PB passes through the lens PL, which focuses the beam onto a target portion C of the substrate W. With the aid of the second positioning mechanism PW and position sensor IF2 (e.g. an interferometric device), the substrate table WT can be moved accurately, e.g. so as to position different target portions C in the path of the beam PB.

Similarly, the first positioning mechanism PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning mechanism PM and PW.

However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in several different modes:
- step mode: the mask table MT is kept essentially stationary, and an entire mask image is projected in one go (i.e. a single "flash") onto a target portion C. The substrate table WT is then shifted in the x and/or y directions so that a different target portion C can be irradiated by the beam PB; and
- scan mode: essentially the same scenario applies, except that a given target portion C is not exposed in a single "flash". Instead, the mask table MT is movable in a given direction (the so-called "scan direction", e.g. the y direction) with a speed v, so that the beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.
- other mode: the mask table MT is kept essentially stationary holding a programmable patterning structure, and the substrate table WT is moved or scanned while a pattern imparted to the beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations of and/or variations on the above-described modes of use or entirely different modes of use may also be employed.

First Embodiment

Figure 2A:
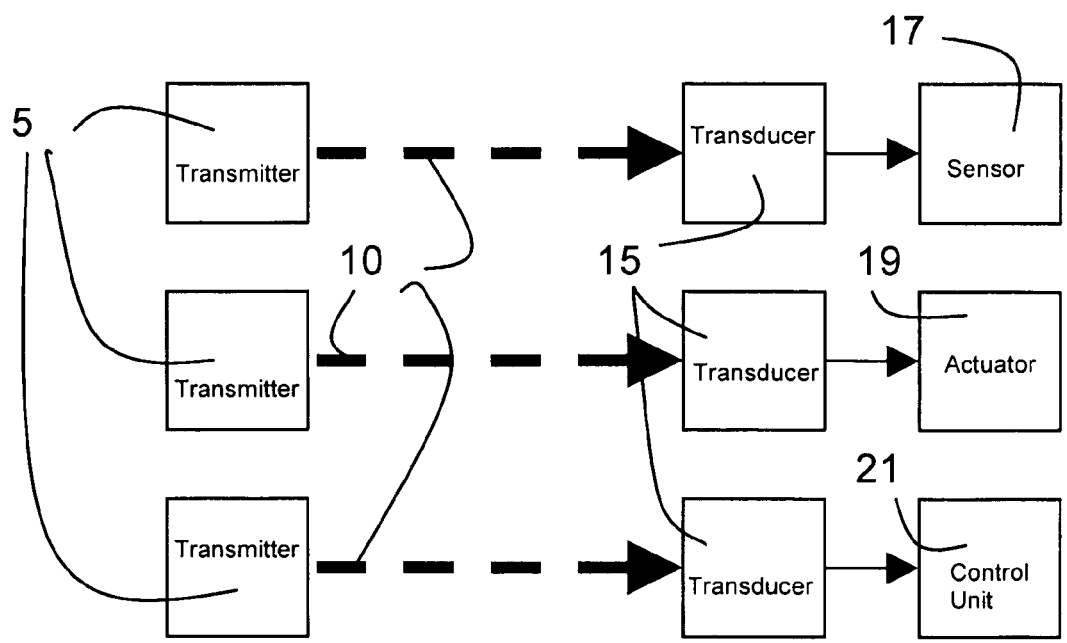
FIG. 2a schematically depicts the relationship between a transmitter, a first transducer and a sensor, an actuator or a control unit according to a first embodiment of the present invention.

The embodiments described herein contemplate a lithographic apparatus configured with the capability of providing wireless signaling, in the form of electromagnetic radiation, to power and/or control mechanisms and devices employed by the apparatus. FIG. 2a schematically depicts the relation between a transmitter 5, a first transducer 15 and a sensor 17, an actuator 19 or a control unit 21 according to a first embodiment of the present invention. In this embodiment, the lithographic apparatus comprises a first transducer 15 for receiving electromagnetic radiation (schematically depicted by the arrow 10) and transforming it into a power signal and/or a control signal. The power signal may be applied to power the sensor 17, the actuator 19 or the control unit 21.

In a first example of such an arrangement, the electromagnetic radiation received by the transducer originates from a time varying magnetic flux. Such a time-varying magnetic flux can, as an example, be generated by a current carrying coil. In this case, the current carrying coil acts as the transmitter of the electromagnetic radiation. The transducer can be equipped with a coil that at least partly receives this time-varying magnetic flux. The time-varying flux will induce a voltage in the coil of the transducer that can be applied to power a sensor or an actuator. This way of wireless energy transmission is particularly interesting in case there is virtually no relative displacement between the transmitter of the time-varying magnetic flux and the transducer equipped with the coil for receiving the magnetic flux.

As an example, this can be applied to power a sensor that is mounted on a stationary part inside a conditioned environment of the lithographic apparatus whereby the transmitter of the low frequency varying magnetic flux is mounted on the outside of the apparatus. Another example is the usually present short-stroke actuator in which coils are used to form a magnetic field that interacts with a number of permanent magnets. A relatively high frequency (>10 kHz) energizing current could be sent through the coils in addition to the current used to create motion by the motor. At these high frequencies, no mechanical movements will result. The high frequency magnetic flux generated by the energizing current could be picked up by an additional coil that is mounted near the permanent magnets.

A time-varying magnetic flux can also be found inside the lithographic apparatus. In most applications, the lithographic apparatus is equipped with a linear or a planar motor. Such motor consist of a first part that is provided with a periodically alternating magnetic field pattern in one or two dimensions, while a second part of the motor is provided with a set of current carrying coils. If this second part is equipped with an additional coil (or coils), the relative movement between first and second part will induce a voltage in the additional coil or coils that can be applied to power a sensor or an actuator mounted on the second part.

As a second example, the electromagnetic radiation received by the transducer can also originate for a high frequency electromagnetic radiation source such as an UHF RF source or a light source (e.g. a laser). In the latter case, the transducer can be equipped with a photo-voltaic cell or a laser diode for transforming the electromagnetic radiation from the light source into an electric signal for powering or controlling a sensor or an actuator.

Typical sensors that can be powered in this way are position sensors such as optical sensors that co-operate with an interferometer beam or a one- or two-dimensional grating, temperature sensors, pressure sensors or vibration detection sensors such as accelerometers or geophones.

Typical actuators that can be powered are short stroke linear actuators for accurate positioning of optical elements of the projection system, substrate tables or mask tables. The arrangement may also be applied to power devices such as relays or proximity switches.

Figure 2B:
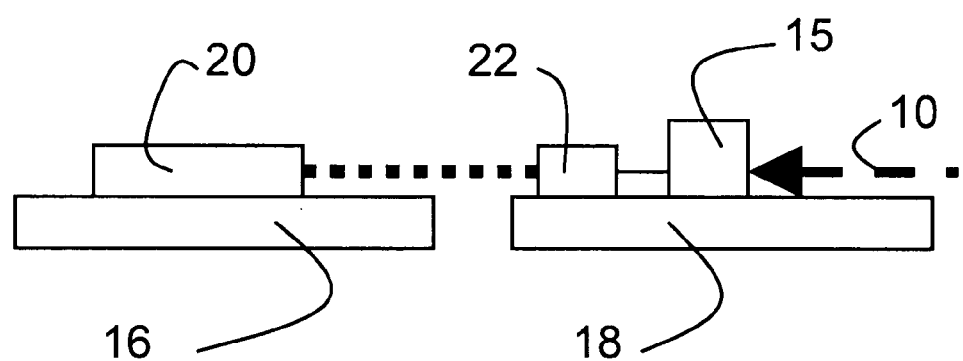
FIG. 2b schematically depicts an arrangement of an interferometer co-operating with a first transducer according to a first embodiment of the present invention.

FIG. 2b schematically depicts an arrangement with an interferometer comprising a laser source 20 and an optical sensor 22. As an example, the laser source be mounted on a stationary part 16 of the apparatus, such as a reference frame, a metrology frame, a lens or a part of the projection system, the optical sensor may be mounted on a stage 18 holding the substrate or the patterning devices. In such an arrangement, it may be advantageous to power the optical sensor 22 by means of a transducer 15 that converts electromagnetic radiation 10 into a power signal. Powering the sensor in a conventional way by means of cable or wire is thereby avoided. A similar arrangement may be applied when the optical sensor is arranged to co-operate with a 1D or 2D grating to measure the displacement of a stage relative to e.g. a lens.

As an alternative to the arrangement shown in FIG. 2b wherein the transducer 15 receives electromagnetic radiation 10 from a transmitter (not shown) and converts it into a power signal to power the optical sensor, the laser beam of the laser source 20 of the interferometer may be applied by the transducer 15 as a source of electromagnetic radiation to power the optical sensor.

In addition to, or as an alternative to providing power, the electromagnetic radiation originating from the transmitter may also comprise information, that can be converted by the transducer into a control signal representing the information. This information signal can further be applied to control the sensor, the actuator or the control unit.

Second Embodiment

Figure 3:
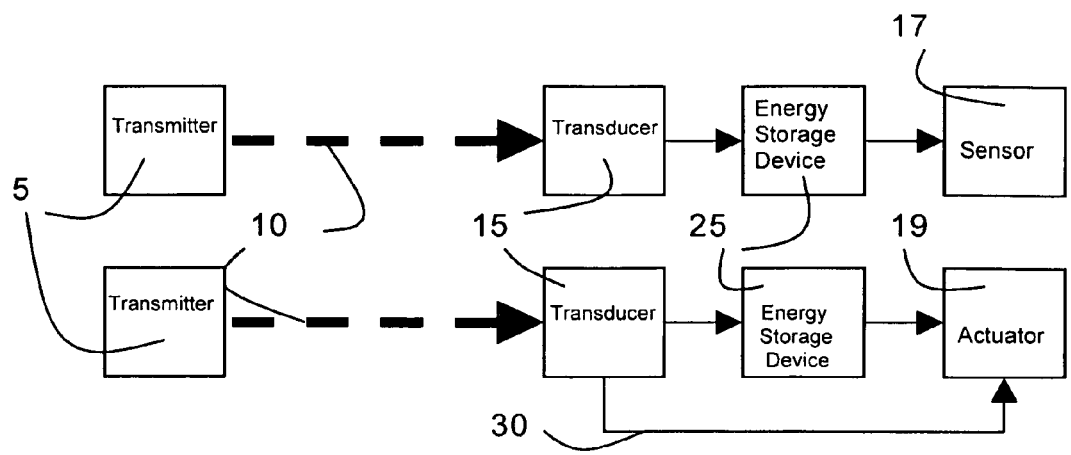
FIG. 3 schematically depicts the relationship between the first transducer, an energy storage device and a sensor or actuator according to a second embodiment of the present invention.

In a second embodiment according to the present invention, the lithographic apparatus is further equipped with an energy storage device. FIG. 3 schematically depicts the relationship between the energy storage device 25, the first transducer 15 and the sensor 17 or actuator 19. In such an embodiment, the power consumption by the actuator or sensor can be different from the power supplied by the electromagnetic radiation and received by the transducer.

By such an arrangement, it is possible to supply power to a sensor continuously while the supply to the energy storage device can be discontinuous: In case the electromagnetic radiation is supplied by a light source, the energy storage device can be charged as long as the photo-voltaic cell receives the light. If the sensor to be powered and the transducer are mounted on a part of the lithographic apparatus that is displaced during the lithographic process, the photo-voltaic cell may only receive the electromagnetic radiation from the light source when it is positioned at certain locations.

When positioned at these locations, the energy storage device can be charged and the sensor can be powered. When positioned at a different location, the stored energy can be applied to power the sensor. It will be clear that the energy stored during the charging period must be sufficient to provide power to the sensor during the time that the energy storage device cannot be charged.

Referring to the example of the voltage induced in a coil attached to the second part of a motor by relative displacement of the first and second motor parts, the induced voltage can be applied to charge a battery provided on the second part of the motor. The stored energy can be applied to power a sensor or actuator even when there is no relative movement of both parts.

An energy storage device as applied in the present embodiment also allows that a higher power is provided to an actuator or sensor than is supplied to the first transducer. As an example, assume the energy storage system is charged with a certain constant power Pin over a time period Tin. The stored energy Pin*Tin can now be applied to power an actuator. In case the power requirements of the actuator are Pact>Pin, this power can be provided to the actuator over a period Tact=Tin*(Pin/Pact). This equation assumes an ideal conversion of the stored energy to the required actuator power. In practice, this conversion will take place with a certain efficiency resulting in Tact<Tin*(Pin/Pact).

It will be clear that the presence of the energy storage device also allows the combination of a discontinuous power supply to the transducer and a discontinuous power consumption from the energy storage device by a sensor or an actuator. Therefore, the presence of the energy storage device presents an important improvement with respect to the flexible use of energy inside the lithographic apparatus.

Further, it should be noted that the electromagnetic radiation received by the first transducer may also contain information that can be applied to control an actuator. This signal 30 comprising the information can be applied to control the power that is supplied to the actuator from the energy storage device 25.

The energy storage device may store the energy under different forms. As an example, the energy storage device may be a rechargeable battery. The energy received by the first transducer may also be converted into kinetic energy. In that case, the energy storage device can be a flywheel. The flywheel can be driven by a small electric motor. The rotor of the motor itself may also act as a flywheel. The flywheel is preferably equipped with a contact-less magnetic bearing to allow frictionless rotation. Such an energy storage device is also well suited to be applied in vacuum since there are no chemical processes involved in the charging or discharging cycle. Other types of kinetic energy storage may also be considered.

Third Embodiment

Figure 4A:
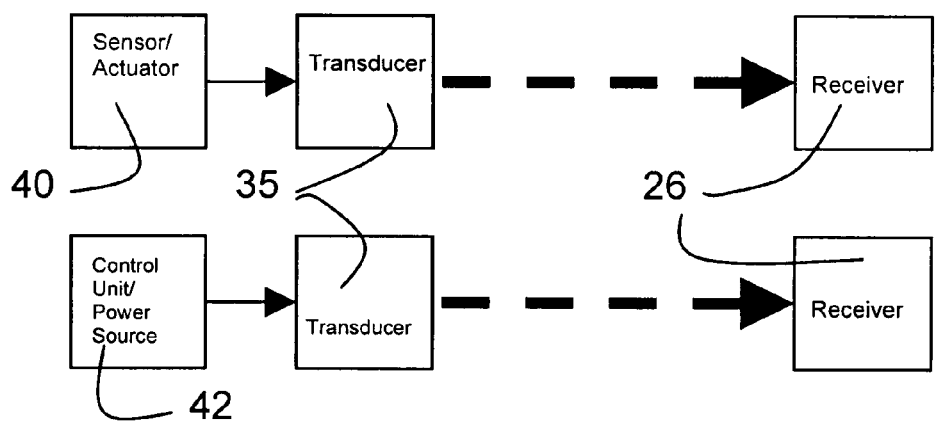
FIG. 4a schematically depicts the relationship between a second transducer and a sensor, an actuator, a control unit or a power source according to a third embodiment of the present invention.

In a third embodiment of the present invention, the lithographic apparatus is equipped with a second transducer 35 (see FIG. 4a) that converts an electric signal from a sensor or actuator 40 into electromagnetic radiation and transmits this electromagnetic radiation to a receiver 26. Such a transducer can be applied to transmit information regarding the physical state of the lithographic apparatus obtained by a sensor to a control unit that is located inside or outside the lithographic apparatus. The transducer 35 may also be applied to convert an electric signal from a control unit or a power source 42 into electromagnetic radiation and transmit this electromagnetic radiation.

As an example, temperature readings can be transferred to the outside of the apparatus without the need to provide a cable or wire for transporting the sensor signal. As an other example, the information obtained from velocity transducers or accelerometers regarding the vibration of an isolated metrology frame can be transmitted to a control unit without the use of a cable or a wire thereby avoiding a mechanical shortcut between the metrology frame and a non-isolated machine part.

Figure 4B:
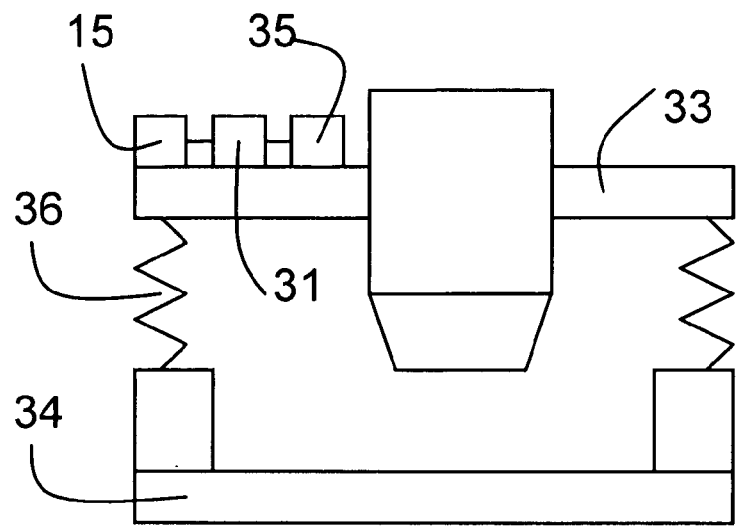
FIG. 4b schematically depicts an arrangement of an accelerometer co-operating with a first transducer and a second transducer according to a third embodiment of the present invention.

FIG. 4b schematically depicts such an arrangement having an accelerometer 31 mounted on a reference frame 33 isolated from a base frame 34 by a vibration isolation system 36. The accelerometer is connected to the first transducer 15 for powering the accelerometer and the second transducer 35 that converts the electric signal from the accelerometer into electromagnetic radiation and transmits it. The transmitter that transmits the electromagnetic radiation to the first transducer and the receiver that receives the electromagnetic energy transmitted by the second transducer are not shown. They can be located inside or outside the lithographic apparatus.

Fourth Embodiment

Figure 5A:
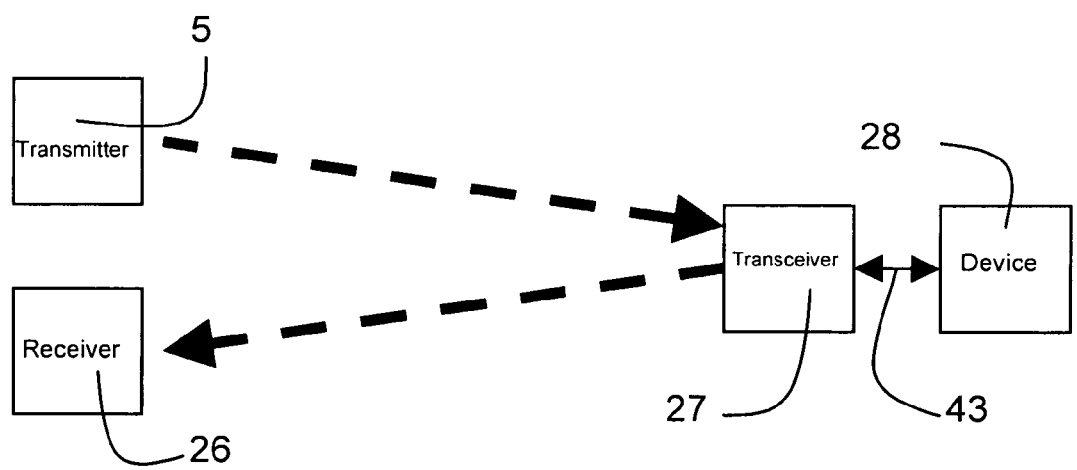
FIG. 5a schematically depicts a bi-directional co-operation between a first transceiver, the transmitter and the receiver according to a fourth embodiment of the present invention.

In a fourth embodiment of the present invention, first and second transducer are integrated into a first transceiver 27 that can both transmit and receive electromagnetic radiation, i.e. the transceiver can operate bi-directionally. As schematically shown in FIG. 5a, the transceiver 27 is constructed and arranged to co-operate with the transmitter 5 for receiving electromagnet radiation, and with the receiver 26. The transceiver may be connected to a device 28 that can be a sensor, or an actuator or a control unit. As indicated by the arrow 43, the communication between the transceiver and the sensor, the actuator or the control unit can also be bi-directional.

Figure 5B:
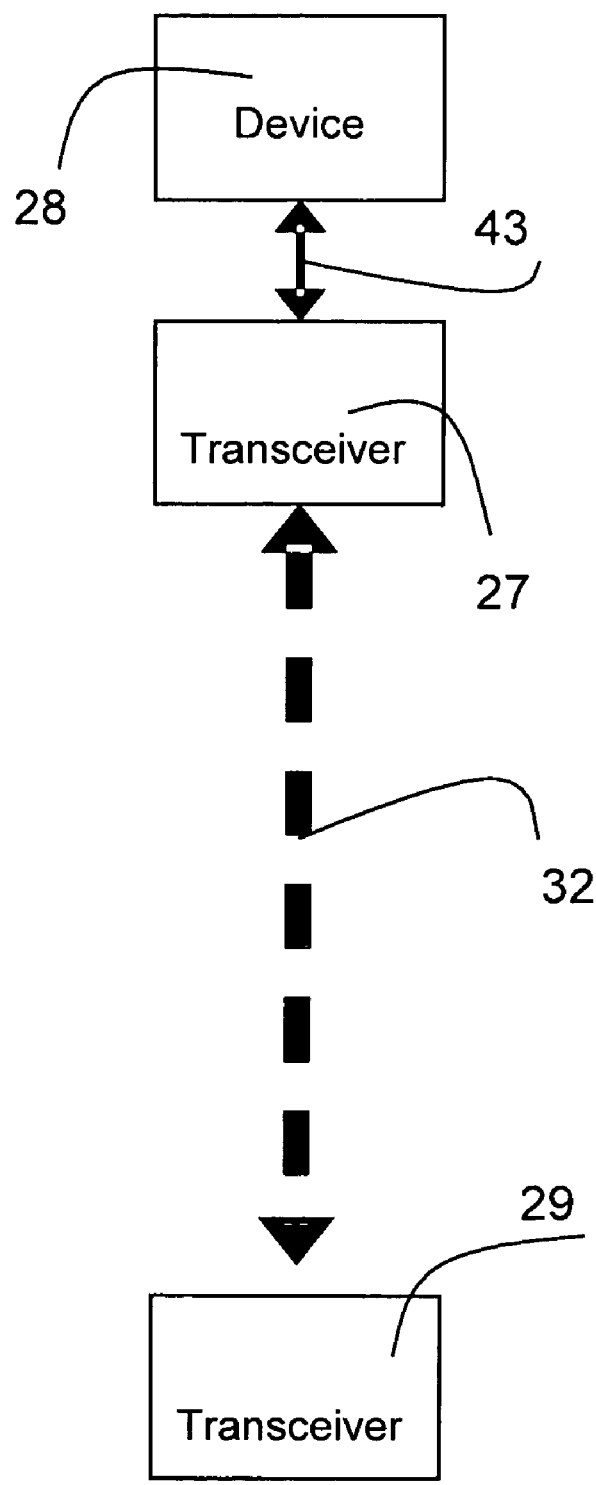
FIG. 5b schematically depicts a bi-direction co-operation between a first transceiver and a second transceiver according to a further arrangement of the fourth embodiment of the present invention.

In a further arrangement of this embodiment, as illustrated in FIG. 5b, the transmitter 5 and the receiver 26 are integrated into a second transceiver 29 that can both transmit and receive electromagnetic radiation. In such an arrangement, both first and second transceiver can operate bi-directional as indicated by the arrow 32. In such an arrangement, the first transceiver can as an example, be connected to a sensor or an actuator or a control unit, the second transceiver can, as an example, be connected to a control unit and/or a power source.

As an example of such an arrangement, a bi-directional RF communication link may be applied for the communication between a sensor or an actuator and a control unit. As an other example, a bidirectional optical communication link may also be applied.

Figure 6:
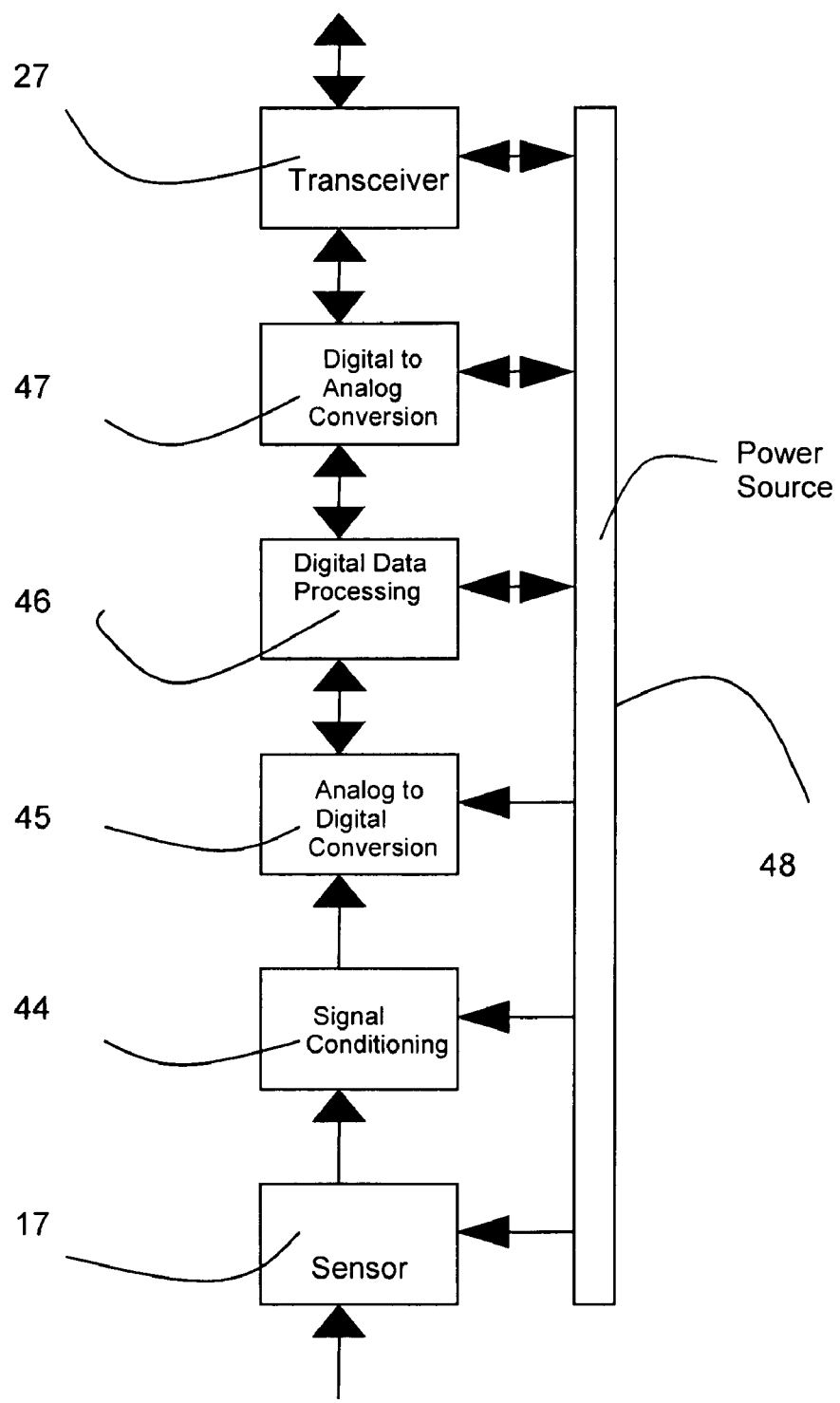
FIG. 6 schematically depicts the different steps to convert a sensor signal to electromagnetic radiation according to an embodiment of the present invention.

It should be noted that, in general, the communication between a transducer or a transceiver and a sensor, actuator, or control unit will involve several steps. FIG. 6 schematically describes a possible way of processing the data between a transceiver 27 and a sensor 17. This process can be described as follows:

the sensor 17 converts the physical quantity into an electric signal;
the signal is conditioned 44, this task may involve amplifying the signal and limiting the signal bandwidth;
task 45 involves an analog to digital conversion;
task 46 involves the processing of the digital data;
task 47 involves a digital to analog conversion, to bring the electrical data into a format that allows transmission in the form of electromagnetic radiation, and vice-versa. This can be done by modulation/demodulation; and
the transceiver 27 converts an electric signal into electromagnetic radiation, and vice-versa.

Each of these step may require a connection to a power source 48.

It will be clear to a person skilled in the art that similar arrangements can be applied for the connections between a transducer and an actuator, a control unit or a power source. Furthermore, it should be noted that one or more of the steps 44 to 47 may be obsolete, depending on the requirements and on the application.

Fifth Embodiment

Figure 7:
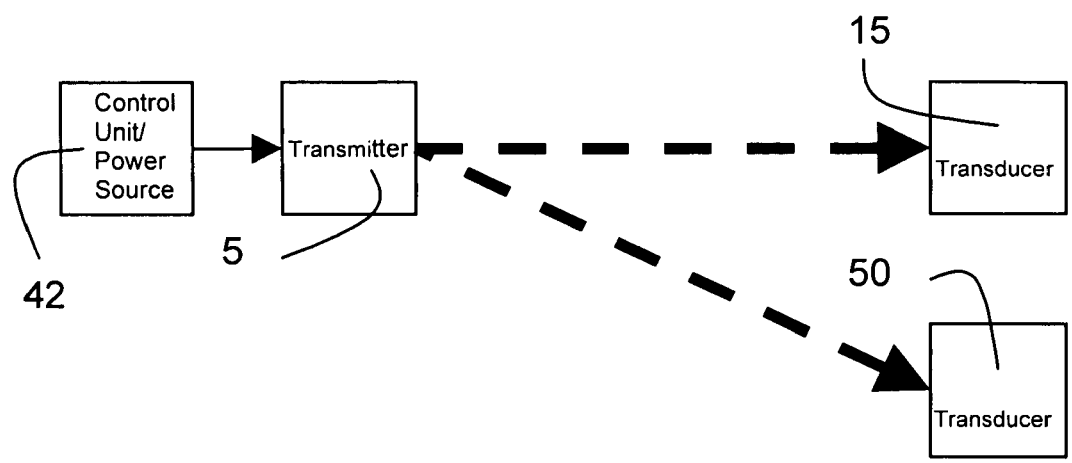
FIG. 7 schematically depicts the relationship between a transmitter and a first and third transducer according to a sixth embodiment of the present invention.
Figure 8:
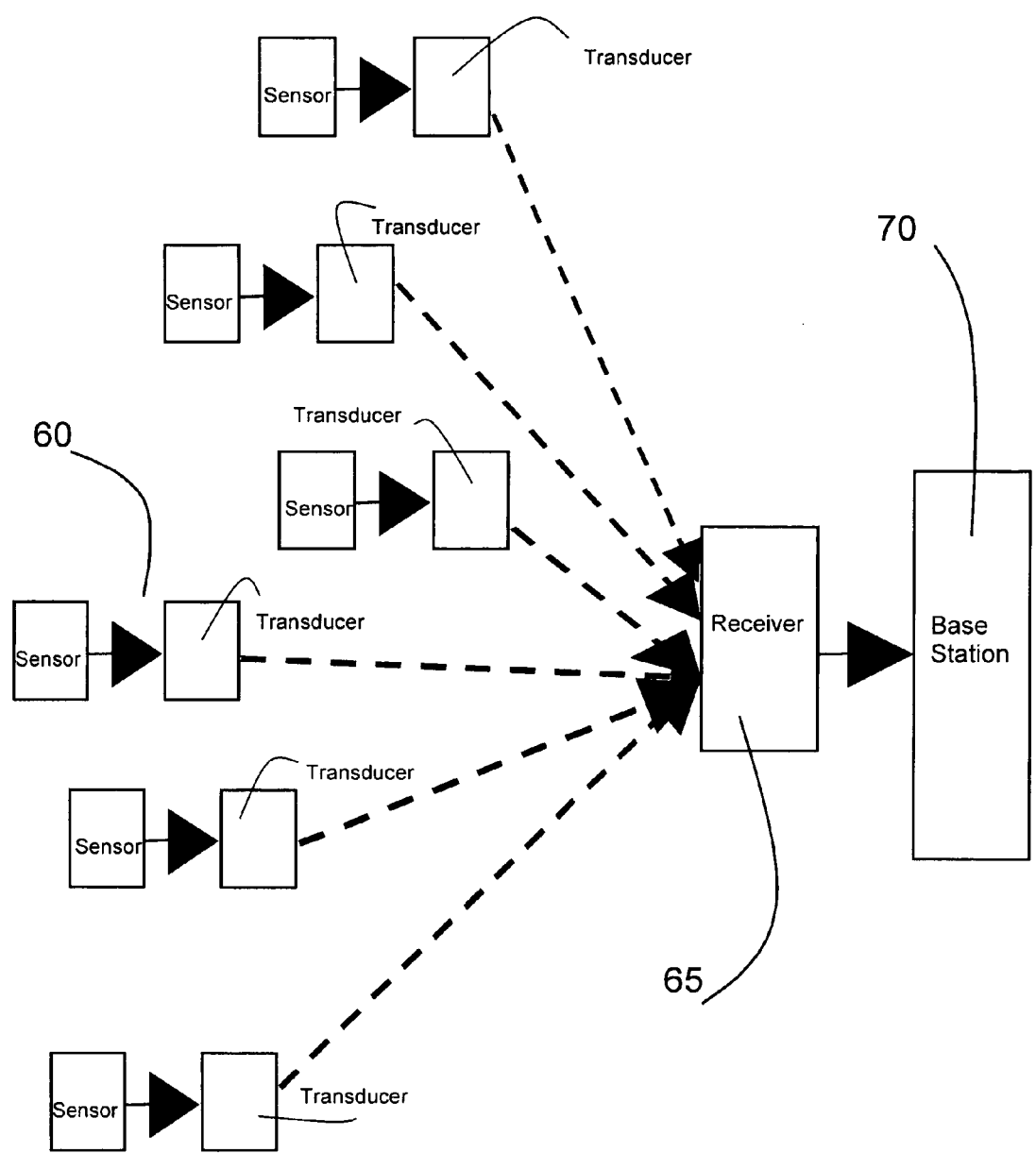
FIG. 8 schematically depicts an arrangement wherein a plurality of sensor & transducer pairs are arranged to co-operate with a common base-station.

In a fifth embodiment of the present invention, the lithographic apparatus comprises two transducers 15, 50 (see FIG. 7) for receiving the electromagnetic radiation and converting the electromagnetic radiation into an electric signal and is arranged to co-operate with one transmitter 5 for transmitting electromagnetic radiation that is received by the two transducers. In such an arrangement, the electromagnetic radiation transmitted (e.g. from the transmitter 5 connected to a control unit or power unit 42) can be received by both transducers. In case the electromagnetic radiation transmitted comprises both information to control an actuator or sensor and energy to be converted into electric power, the transducers 15, 50 may get a dedicated task, i.e. converting the electromagnetic radiation into a control signal or converting the electromagnetic radiation into a power signal. This may simplify the design of both the transducers.

Sixth Embodiment

In an other embodiment of the present invention, the lithographic apparatus is equipped with a plurality of sensor & transducer pairs 60, wherein the electromagnetic radiation transmitted by the plurality of transducers is received by a base-station 70, common to the plurality of transducers (FIG. 9). The base-station is connected to a receiver 65 that receives the transmitted electromagnetic radiation from the sensor & transducer pairs 60. This base-station can either be placed inside or outside the lithographic apparatus. The base-station can convert the electromagnetic radiation received from the different transducers into electric signals that can be processed by a control unit.

In case the base-station is placed inside the apparatus, the communication between the base-station and the control unit can take place using conventional wires or cables or may also be performed by means of a transducer (for transmitting) in the base-station and a transducer (for receiving) in the control unit. In case the base-station is put inside the lithographic apparatus and the communication to an external control unit is done by conventional wiring, the base-station is preferably placed on a location where the wiring does not introduce any mechanical shortcuts and the outgassing requirements allow the use of wires or cable.

As an example, the plurality of sensors and transducers may be applied inside a processing chamber, the processing chamber being mounted on a base by means of an vibration isolation system, while the base-station is mounted on the base of the lithographic apparatus. Such a processing chamber may be a vacuum chamber or a chamber wherein a conditioned atmosphere is maintained. It should further be noted that the transfer of electromagnetic radiation can be bi-direction.

Additionally, a transmitter connected to a power source can be applied to transmit electromagnetic radiation towards the sensor & transducer pairs to power them. In an alternative arrangement, a subset of the plurality of sensors may also have a common transducer that transmits the information obtained from the sensors to the base station. As an example, a projection system may comprise a set of mirrors or lenses, each of these mirrors or lenses being equipped with 6 position sensors for measuring the position in 6 degrees of freedom. In such an arrangement, the 6 position sensors designated to one mirror or lens may have a common transducer for transmitting the position information to the base-station. In case the transducers are bi-directional, they may also be applied to power the sensors.

Alternatively, powering the sensors may also be done by a separate transducer receiving electromagnetic radiation from a transmitter and converting it into a power signal that is wired to either an energy storage device or to the different sensors or both.

It will be appreciated that the arrangements as shown in FIGS. 4a to 7 may also be combined with an energy storage device as described in FIG. 3.

It should further be noted that in the different embodiments described, the first transducer can be arranged to convert (demodulate) the electromagnetic radiation into the control signal according to frequency demodulation and/or amplitude demodulation techniques. Similarly, the second transducer may modulate the electromagnetic radiation according to frequency and/or amplitude modulation techniques.

Whilst specific embodiments of the invention have been described above, it will be appreciated that the invention may be practiced otherwise than as described. The embodiments described above may, instead, be implemented in different embodiments of software, firmware, and hardware in the entities illustrated in the figures.

As such, the description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. A lithographic apparatus comprising:
   an illumination system to provide a beam of radiation;
   a support configured to support a patterning device, the patterning device serving to impart the beam of radiation with a pattern in its cross-section;
   a substrate holder configured to hold a substrate;
   a projection system to project said patterned beam of radiation onto a target portion of said substrate;
   a positioning mechanism configured to position at least a portion of at least one of said support, said substrate table, said projection system, and said illumination system;
   a transmitter configured to transmit electromagnetic radiation; and
   a first transducer configured to receive and convert said electromagnetic radiation into a power signal to power at least one of a sensor, an actuator and a control unit.

2. The lithographic apparatus of claim 1, wherein said electromagnetic radiation contains information and said first transducer is further configured to generate said power signal representing the information.

3. The lithographic apparatus of claim 1, wherein said transmitter is located outside the lithographic apparatus.

4. The lithographic apparatus of claim 1, wherein the lithographic apparatus further comprises an energy storage device constructed and arranged to receive said power signal.

5. The lithographic apparatus of claim 2,
   wherein said sensor is configured to sense a state of at least one of said illumination system, said projection system, said patterning device, and said substrate and to produce a first electric signal representing the state, and the lithographic apparatus further comprising
   a second transducer configured to convert said first electric signal into electromagnetic radiation and to transmit the electromagnetic radiation,
   wherein the lithographic apparatus is further arranged to co-operate with a receiver for receiving the electromagnetic radiation transmitted by the second transducer and converting it into a second electric signal.

6. The lithographic apparatus of claim 5, wherein said transmitter and said receiver are integrated into a first transceiver, said first transceiver being constructed and arranged to transmit and receive said electromagnetic radiation.

7. The lithographic apparatus of claim 6, wherein the transmitter and receiver are integrated into a second transceiver, the second transceiver being constructed and arranged to transmit and receive said electromagnetic radiation.

8. The lithographic apparatus of claim 1, wherein the electromagnetic radiation contains information and wherein the lithographic apparatus further comprises an additional transducer that is arranged to generate a control signal representing the information.

9. A lithographic apparatus comprising:
   an illumination system to provide a beam of radiation;
   a support structure configured to support a patterning device, the patterning device serving to impart the beam of radiation with a pattern in its cross-section;
   a substrate holder configured to hold a substrate;
   a projection system to project said patterned beam radiation onto a target portion of said substrate; and
   a wireless signaling system configured to transmit and receive information-bearing electromagnetic radiation, wherein the information contained in said information-bearing electromagnetic radiation is used to power at least one of a sensor, an actuator and a control unit arranged in at least a portion of at least one of said support structure, said substrate table, said projection system, and said illumination system.

10. The lithographic apparatus of claim 9, wherein said wireless signaling system comprises:
    a transmitter configured to transmit said electromagnetic radiation; and
    a first transducer configured to receive and convert said electromagnetic radiation into a first electrical signal containing the information which is used to power at least one of said sensor, said actuator and said control unit.

11. The lithographic apparatus of claim 10, further comprising an energy storage device constructed and arranged to receive said first electrical signal.

12. The lithographic apparatus of claim 10, wherein said sensor is configured to sense a state of at least one of said illumination system, said projection system, said patterning device, and said substrate and to produce a second electric signal representing the state, and said wireless signaling system further comprises
    a second transducer configured to convert said second electric signal into electromagnetic radiation and to transmit the electromagnetic radiation, and
    a receiver for receiving the electromagnetic radiation transmitted by the second transducer and converting it into a third electric signal.

13. The lithographic apparatus of claim 12, wherein said transmitter and said receiver are integrated into a first transceiver, said first transceiver being constructed and arranged to transmit and receive said electromagnetic radiation.

14. The lithographic apparatus of claim 13, wherein the transmitter and receiver are integrated into a second transceiver, the second transceiver being constructed and arranged to transmit and receive said electromagnetic radiation.

15. A device manufacturing method, comprising:
    providing a beam of radiation using an illumination system;
    using a patterning device to impart the beam with a pattern in its cross-section;
    projecting the patterned beam of radiation onto a target portion of the substrate; and
    sensing a state of at least one of said illumination system, said projection system, said patterning device, and said substrate with a sensor;
    producing an electric signal representing the state;
    converting said electric signal into electromagnetic radiation by a first transducer;
    wirelessly transmitting said electromagnetic radiation to a receiver, and
    wirelessly powering said sensor.

16. A lithographic method comprising:
    transmitting a beam of radiation through an illumination system;
    patterning said beam of radiation with a patterning device;
    projecting said patterned beam of radiation onto a substrate;
    positioning at least one of said patterning device and said substrate relative to the other to enable different portions of said substrate to be imaged; and wirelessly powering at least one of a sensor, an actuator and a control unit used in controlling at least one of said transmitting, patterning, projecting and said positioning.

17. A lithographic apparatus comprising:

an illumination system to provide a beam of radiation;

a support that supports a patterning device, the patterning device serving to impart the beam of radiation with a pattern in its cross-section;

a substrate holder configured to hold a substrate;

a projection system that projects the patterned beam of radiation onto substrate; and means for wirelessly powering at least one of a sensor, an actuator and a control unit used in controlling at least one of said illumination system, said support, said substrate holder and said projection system.

18. The lithographic method of claim 16, further comprising wirelessly controlling at least one of said transmitting, patterning, projecting and said positioning.

19. The lithographic apparatus of claim 17, further comprising means for wirelessly interfacing with at least one of said illumination system, said support structure, said substrate holder and said projection system.

* * * * *